United States Patent
Qian

(10) Patent No.: US 6,891,853 B1
(45) Date of Patent: May 10, 2005

(54) FRAME MATCHING METHOD

(75) Inventor: Feng Qian, Mission Viejo, CA (US)

(73) Assignee: VIA Telecom Co., Ltd., San Diego, CA (US)

( * ) Notice: Subject to any disclaimer, the term of this patent is extended or adjusted under 35 U.S.C. 154(b) by 921 days.

(21) Appl. No.: 09/687,700

(22) Filed: Oct. 12, 2000

(51) Int. Cl.⁷ .............................. H04J 3/07; H04J 3/12; H03M 13/03
(52) U.S. Cl. ...................... 370/468; 370/505; 370/523; 714/790
(58) Field of Search .................................. 370/454–468, 370/505–523; 375/295–372, 262, 265; 714/786–790, 775, 794, 795

(56) References Cited

U.S. PATENT DOCUMENTS

| | | | | |
|---|---|---|---|---|
| 5,802,079 A | * | 9/1998 | Wang | 714/775 |
| 5,802,122 A | * | 9/1998 | Niegel | 375/372 |
| 6,397,367 B1 | * | 5/2002 | Park et al. | 714/786 |
| 6,580,762 B1 | * | 6/2003 | Tsumura | 375/295 |
| 6,601,214 B1 | * | 7/2003 | Hammons, Jr. | 714/790 |
| 6,622,281 B1 | * | 9/2003 | Yun et al. | 714/790 |

* cited by examiner

Primary Examiner—Man U. Phan
(74) Attorney, Agent, or Firm—Howard Chen; Preston Gates & Ellis LLP

(57) ABSTRACT

A frame of digital data with L symbols is matched to a frame with N symbols by making that number of copies of the original L symbols that results in N symbols. In particular, M=floor(N/L) is computed. L2=N−ML is computed. (L1=L−L2 where L1 and L2 solve the simultaneous equations L1+L2=L and L1*M+L2*(M+1)=N). The frame is effectively divided into two mutually exclusive groups of symbols; one group (consisting of L1 symbols) is copied M times and the other group (consisting of L2 symbols) is copied M+1 times.

6 Claims, 2 Drawing Sheets

FRAME MATCHING METHOD

BACKGROUND OF THE INVENTION

1. Field of the Invention

This invention relates to frame based digital communication systems and more particularly to a method for processing frames having a certain size in systems configured for frames having a different size.

2. Description of the Related Art

Digital data is often communicated in frames, which are groups of digital data that are processed together, as will be further described below. Often, it is desired to send or receive frames having a certain size in systems configured for different sized frames. For example, in the IS2000.2-A standard for code division multiple access (CDMA) communications, encoded symbols at a rate of L symbols per frame must be matched with a transmission scheme that processes N symbols per frame, where N is greater than L. In this case, for any one frame, the L symbols are repeated M times, where M is the smallest integer such that ML>N. Then, the ML symbols are reduced to N symbols by deleting (puncturing) P symbols, where P=ML−N. There is no appreciable loss of information since in CDMA, many symbols are redundant to provide robust protection against transmission errors; deleting a few redundant symbols will typically not cause any significant problems, especially if the symbols are far apart.

The above mentioned two stage approach has drawbacks. If complex control logic is not used, then it requires unnecessary additional memory to store the ML symbols; in the worst case, this can be almost twice as much memory as would otherwise be required if the actual frame size is only 1 bit shorter than the standard frame size. Moreover, additional data transfer (re-arrangement) is needed because of the two-stage processing.

It would be desirable to improve upon the above mentioned scheme.

SUMMARY OF THE INVENTION

According to the present invention, a frame of digital data with L symbols is matched to a frame with N symbols without (preferably) the need for performing any puncturing. This is performed by making that number of copies of the original L symbols that results in N symbols. In particular, M=floor(N/L) is computed. L2=N−ML is computed. (L1=L−L2 where L1 and L2 solve the simultaneous equations L1+L2=L and L1*M+L2*(M+1)=N). The frame is effectively divided into two mutually exclusive groups of symbols; one group (consisting of L1 symbols) is copied M times and the other group (consisting of L2 symbols) is copied M+1 times.

BRIEF DESCRIPTION OF THE DRAWINGS

Other objects and advantages of the invention will become apparent upon reading the following detailed description and upon reference to the accompanying drawings in which.

Figure 1:
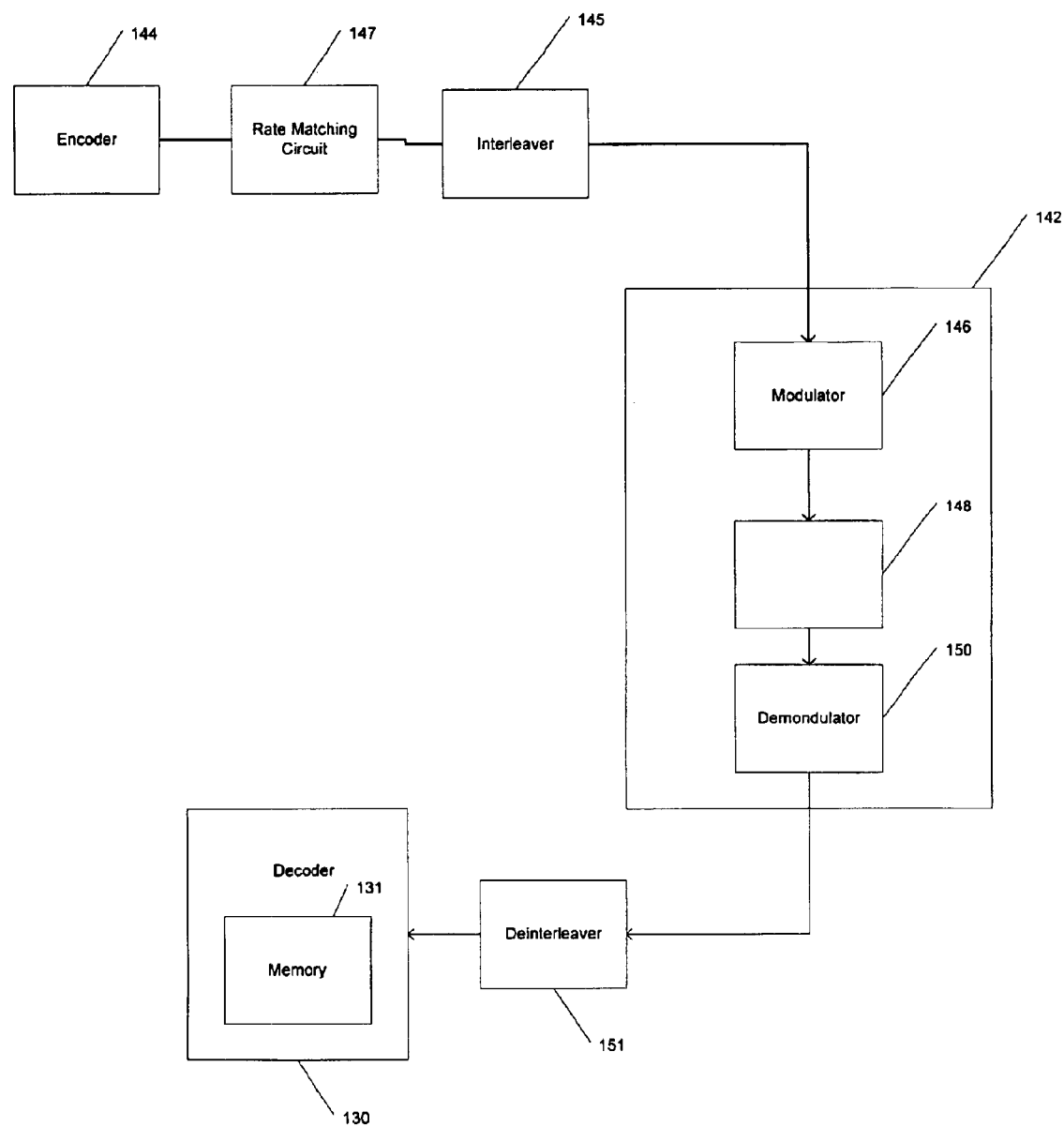
FIG. 1 is a block diagram of a possible digital communication system that includes a frame matching circuit the implements a frame matching method according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

This specification describes frame matching methods in the context of CDMA systems. However, it will be appreciated that the present invention is not restricted to CDMA systems. FIG. 1 represents a digital communications system 140 within which the present invention may be embodied. As shown, the digital system 140 comprises a discrete-time channel 142 interposed between an encoder 144 and a decoder 130, which includes a memory module 131. Discrete-time channel 142 comprises a modulator 146, a channel 148 and a demodulator 150. An interleaver 145 is interposed between the encoder 144 and the modulator 146. A deinterleaver 151 is interposed between the decoder 130 and the demodulator 150. Channel 148 may be a transmission channel or a storage medium being written to and read from. Interleaver 145 receives a digital output signal from a rate matching circuit 147, which in turn receives a digital signal from an encoder 144. The interleaver 145 interleaves this digital output signal over a certain time period, which is usually predetermined and known as a frame. Modulator 146 serves to translate the digital output signal from interleaver 145 into signals suitable for channel 148 and thereafter drives the signals across channel 148.

Channel 148 may suffer from interference that corrupts said signals, the interference possibly taking form in any combination of additive noise, cross channel interference, multi-path interference, and channel fading. Demodulator 150 serves to receive the signals from channel 148 while minimizing the interference as much as is practical, and thereafter translate the signals into digital signals for input to deinterleaver 151, which deinterleaves the digital signal and provides it to decoder 130. Discrete-time channel 142 can thus be viewed as a unit accepting digital input signals and producing possibly corrupted digital output signals although the present invention is not limited to noisy channels.

Encoder 144 is a convolutional encoder which serves to add redundancy to input data signal 152. The output of the encoder 144 is L symbols per frame, which must be matched with the interleaver 145, which interleaves N symbols per frame, where N is greater than L. This matching is performed by the rate matching circuit 147, which repeats the L symbols of an input frame in such a manner that an N symbol frame is produced.

Figure 2:
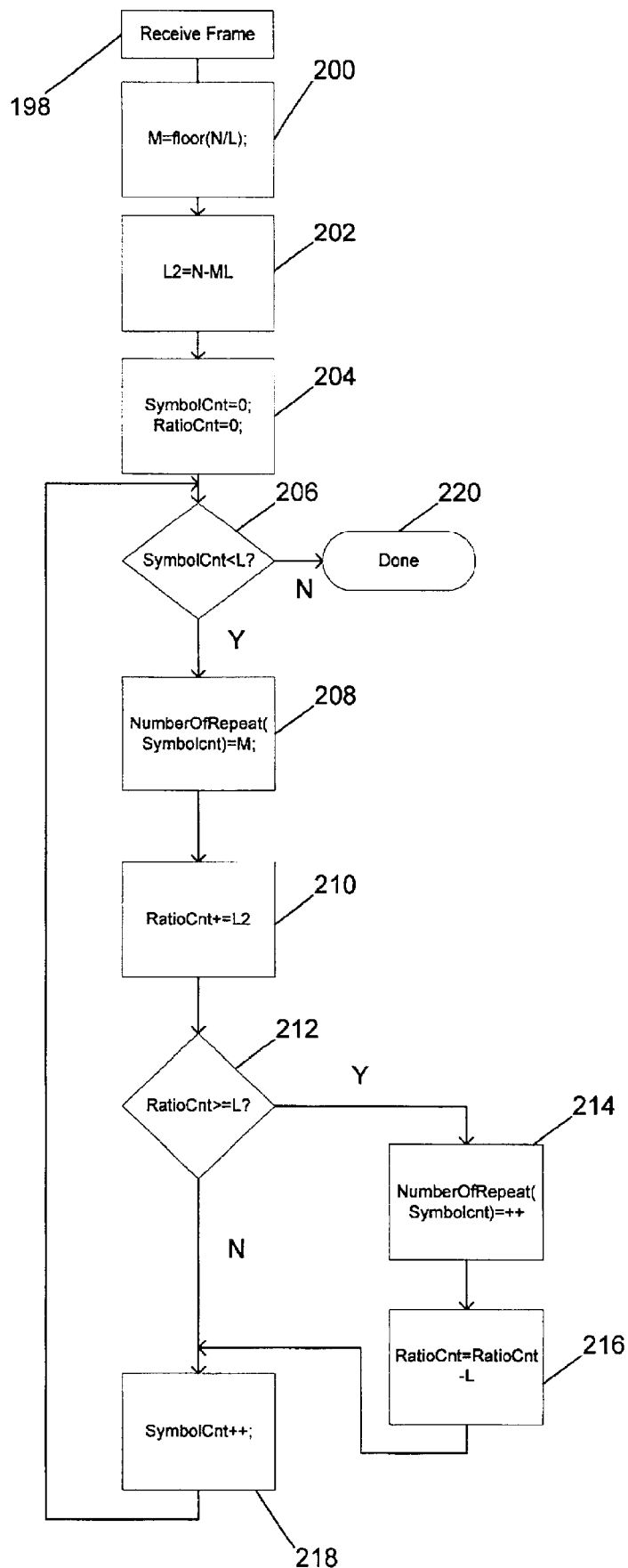
FIG. 2 is a flow chart of a frame matching method according to the present invention.

FIG. 2 is a flow chart that describes an embodiment of the matching circuit 147 according to the present invention. In block 198, a frame is received. (It will be appreciated that the frame need not be received all at once and the steps described below may be initiated before the entire frame is received). In block 200, M=floor(N/L) is computed. In block 202, L2=N−ML is computed. (L1=L−L2 where L1 and L2 solve the simultaneous equations L1+L2=L and L1*M+L2*(M+)=N). As will be described further below, the frame is effectively divided into two mutually exclusive groups of symbols; one group (consisting of L1 symbols) will be copied M times and the other group (consisting of L2 symbols) will be copied M+1 times.

The below described steps serially process the symbols, selecting each symbol for inclusion in one group or the other. It will be appreciated that the two groups may be distributed in any manner so long as the totals for each group are L1 and L2 respectively at the end of the frame. For example, the first L1 symbols in a frame could be selected for the first group and the remaining L2 symbols selected for the second group. According to the preferred embodiment described below, the distribution is such that, at any time in the process, the ratio between A/B is as close to 1 as possible, where A is the total number of symbols that have previously been selected for the first group and B is the total number of symbols that have previously been selected for the second group. In other words, the groups are selected more or less evenly, according to the ratio L1:L2.

In block 204, two variables, SymbolCnt and RatioCnt are initialized to 0. Block 206 is the start of a while loop, which exits at block 220 (and is then further processed by a digital communications system, which, in the case of the system in FIG. 1, means it is then interleaved by interleaver 145) when SymbolCnt is equal to L (i.e. it exits when all of the symbols have been processed). Within the while loop, an array NumberOfRepeat is indexed by SymbolCnt; each element in NumberOfRepeat stores the number of times the symbol corresponding SymbolCnt will be multiplied (i.e. either M or M+1 times). For example, if NumberOfRepeat(0)=M, then the $0^{th}$ symbol will be repeated M times. Specifically, in block 208, NumberOfRepeat(SyrnbolCnt) is set equal to M.

In block 210, a variable RatioCnt is set equal to its current value+L2. RatioCnt, as its name implies, essentially tracks the distribution between multiplications by L1 and L2. In block 212, it is determined whether RatioCnt is greater than or equal to L. If so, this means that the current symbol must be repeated M+1 times; thus, in block 214, NumbeOfRepeat(SymbolCnt) is set to M+1 (i.e. its current value M, incremented by 1). Also, RatioCnt must be reduced by L, which is done in block 216. In block 218, SymbolCnt is incremented and the process loops back to block 206.

Conclusion

Numerous variations and modifications will become apparent to those skilled in the art once the above disclosure is fully appreciated. It is intended that the following claims be interpreted to embrace all such variations and modifications.

What is claimed is:

1. A method for increasing a size of a frame of digital data from a first number of original symbols (L) to a second number of symbols (N), where the digital data comprising the frame is ordered from a first bit to an Lth symbol, the method comprising the steps of:
    (a) Receiving the frame;
    (b) Storing in a digital memory a first integer number (M) of copies of each of a first group of the original symbols, where M is greater than 1;
    (c) Storing in the digital memory at least one copy of each of a second group of the original symbols;
    (d) Further processing the symbols stored in the digital memory according to steps (b) and (c) in a digital communications system;
    wherein the frame consists of the first group and the second group and the first group and the second group are mutually exclusive; and wherein steps (b) and (c) are performed such that the total number of symbols copied to the digital memory in steps (b) and (c) is equal to N.

2. The method according to claim 1 wherein step (b) is performed such that each of the second group of symbols is multiplied by the same number X.

3. The method according to claim 2 wherein X=M+1.

4. The method according to claim 3 wherein the first group and the second group are selected by serially processing the symbols.

5. The method according to claim 4 wherein symbols are selected to be in the first group or the second group such that, where A is a total number of symbols that have previously been selected for the first group and B is a total number of symbols that have previously been selected for the second group, the ratio between A/B is as close to 1 as possible.

6. The method according to claim 1 where M=floor(N/L).

* * * * *